United States Patent [19]

Lyhus

[11] 4,271,512
[45] Jun. 2, 1981

[54] INFORMATION COLLECTION AND STORAGE SYSTEM WITH MEMORY TEST CIRCUIT

[76] Inventor: Arlan J. Lyhus, 12416 Hooper Ct., Fulton, Md. 20759

[21] Appl. No.: 25,489

[22] Filed: Mar. 30, 1979

[51] Int. Cl.³ ............................................ G01R 31/28
[52] U.S. Cl. ...................................... 371/21; 371/25; 235/92 TC; 340/31 A
[58] Field of Search ............................. 371/21, 24, 25; 235/92 TC; 340/31 A; 364/900 MS File

[56] References Cited

U.S. PATENT DOCUMENTS

| | | | |
|---|---|---|---|
| 3,549,869 | 12/1970 | Kuhn | 235/92 TC |
| 3,869,603 | 3/1975 | Auspurg et al. | 371/21 |
| 3,940,601 | 2/1976 | Henry et al. | 371/21 |
| 3,978,321 | 8/1976 | Doggett | 235/92 TC |
| 4,055,754 | 10/1977 | Chesley | 371/21 |
| 4,061,908 | 12/1977 | de Jonge et al. | 371/21 |
| 4,167,040 | 9/1979 | Heritier et al. | 235/92 TC |

Primary Examiner—Charles E. Atkinson
Attorney, Agent, or Firm—LeBlanc, Nolan Shur & Nies

[57] ABSTRACT

An information recording system having an electrical circuit for counting serially occurring pulses, the number of which is indicative of certain information, a memory storage unit adapted to be removably plugged into said circuit for connection thereto and having a memory containing a multiplicity of binary bit storage cells or character locations for storing binary data resulting from the counting of the pulses, a means connected in said electrical circuit and responsive to the connection of the memory storage unit to the electrical circuit for interrogating the logic bit state in each of the memory's character locations to determine if the stored logic states conform to a pre-selected code, and a display device, or other suitable means rendered effective by the interrogating means for signalling an operator whenever the logic state in any one of the character locations fails to conform to the pre-selected code.

5 Claims, 5 Drawing Figures

INFORMATION COLLECTION AND STORAGE SYSTEM WITH MEMORY TEST CIRCUIT

FIELD OF INVENTION

This invention relates to information recording systems having a removable data-storing memory.

BACKGROUND OF THE INVENTION

The present invention is primarily directed to improvements in vehicular traffic recorders and other information recording systems in which counts of data-representing electrical pulses are stored in a removable semiconductor memory pack. During a traffic counting or other information collecting operation the memory pack is plugged into the recording unit to store the sensed data in binary form. Thereafter, the memory pack is removed from the unit for transportation to a suitable data processing or information gathering center where the stored data is read out.

The removable memory pack feature eliminates the need for returning the entire recording unit to the data processing or information gathering center. The recording unit may therefore remain in the field for further use simply by plugging a fresh memory pack into the recorder unit in place of the one that was removed for return to the data processing center for read-out. After reading out the stored data the memory packs are usually cleared and then may be returned to the field for recording additional data.

With the foregoing type of recording system there is a possibility that in exchanging memory packs the operator of the system will mistakenly place in operation a used memory pack which has not been read out and which contains information from a prior traffic counting or other information collection operation. If this happens new traffic data will be written into the memory over the original data when it is plugged into the recording unit, thereby erasing the original data.

The present invention avoids the foregoing problem as will become apparent from the following summary and detailed description.

SUMMARY AND OBJECTS OF INVENTION

In accordance with this invention the information recording system or unit is equipped with a memory test circuit which alerts the person operating the recording system that the inserted memory pack is defective or contains previously recorded information which has not been read-out or translated. The memory test circuit may also be designed to inhibit the recording unit, thereby preventing new information from being written into the memory pack.

With the foregoing in mind a major object of this invention is to provide a novel traffic counting or other information recording system or unit which is equipped to alert an operator that the inserted memory pack does not contain a pre-selected code.

A further object of this invention is to provide a novel information recording system of the type set forth in the preceding object wherein the recording unit, upon sensing the presence of data in the inserted memory pack, operates to prevent new data from being written into the memory over the original information already stored in the memory pack.

The foregoing objects are accomplished by programming the memory pack with a special code before it is placed in use and by automatically interrogating the memory pack for the programmed code upon plugging the memory pack into the recording unit. If the memory test circuit fails to sense the special code it will produce a suitable signal, such as a visual signal on the recording unit's display, to alert the operator to the presence of data other than the special code in the inserted memory pack.

Although the system incorporating the principles of this invention is particularly applicable for recording vehicular traffic data, it also may be used for numerous other purposes. For example, when interfaced with the appropirate transducer, it may be used to collect and store such information or data as rain measurements, water flow measurements, water pollution measurements and air pollution measurements.

DETAILED DESCRIPTION

Figure 1:
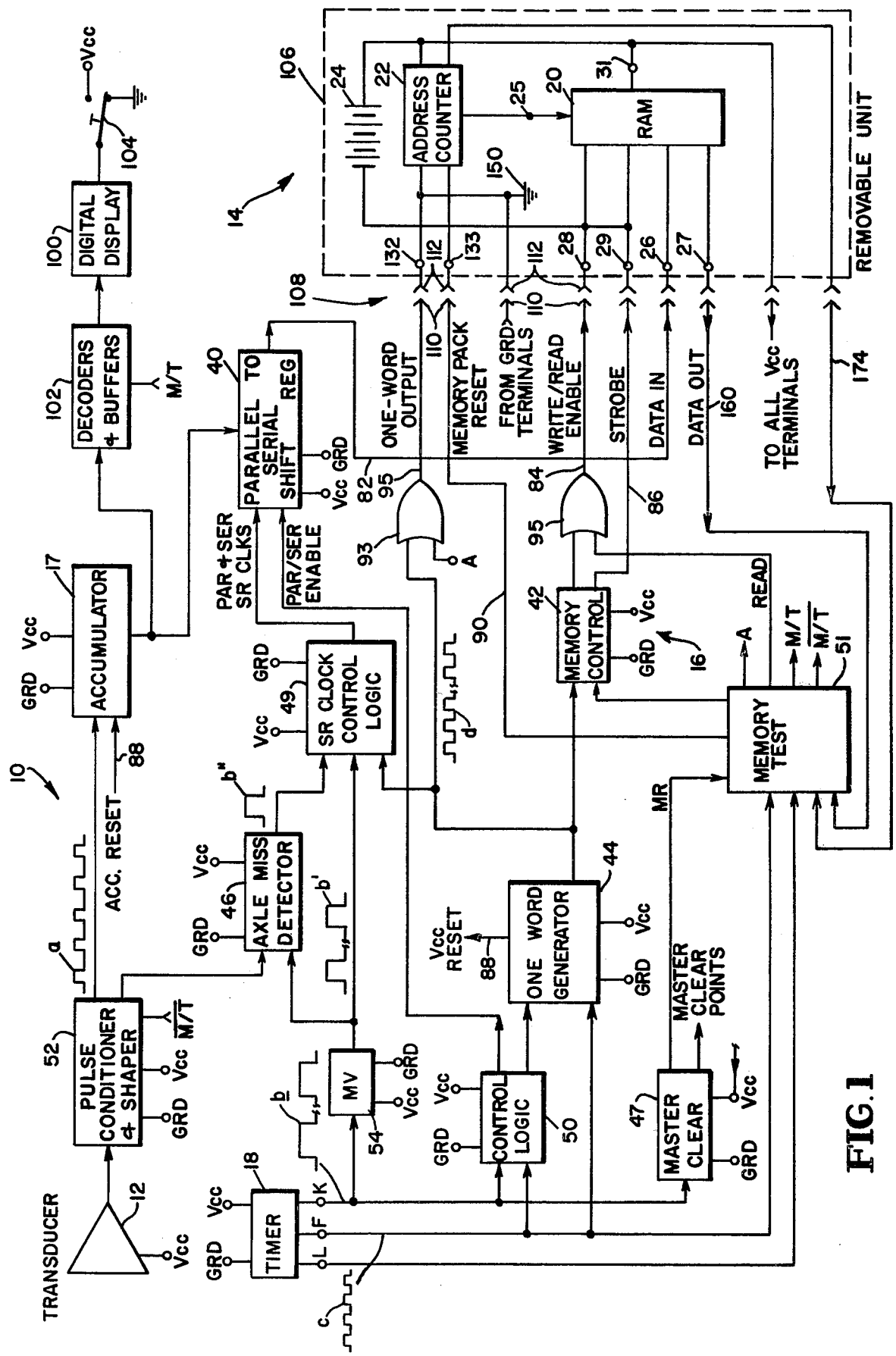
FIG. 1 is a schematic diagram of a single channel information collection and storage system incorporating the principles of this invention.
Figure 2:
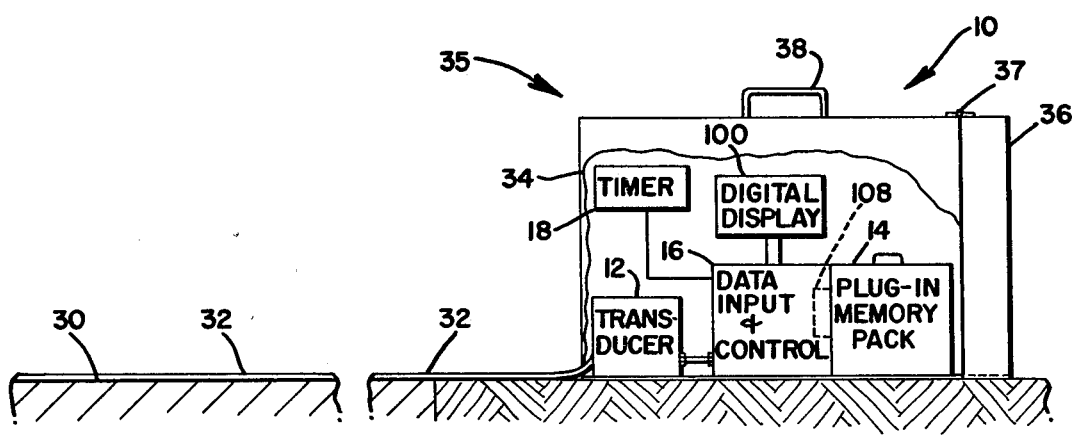
FIG. 2 is a generally schematic elevation of an axle-counting traffic recorder incorporating the system shown in FIG. 1.

In FIGS. 1 and 2 of the drawings, the information collection and storage system embodying this invention is generally indicated at 10 and mainly comprises a transducer 12, a selectively removable memory and battery pack or module 14, and a digital data input and control unit or circuit 16. In the illustrated embodiment, transducer 12 is of the type that produces an electrical digital signal in which the number of serially occurring pulses (indicated at a in FIG. 1) is indicative of a sensed condition or event. This digital signal is fed to the data input and control circuit or unit 16 which is interfaced or connected between transducer 12 and the removable memory pack 14.

As will be described in detail shortly, the data input and control unit 16 includes a counter or accumulator 17 for counting the number of pulses in the transducer's digital output signal. Unit 16 also includes control circuitry whereby the count in accumulator 17 is periodically transferred to and stored in the memory of memory pack 14 under the control of a timer 18.

Figure 3:
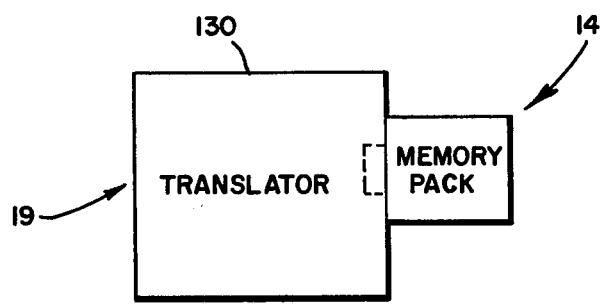
FIG. 3 is a schematic diagram wherein the removable memory pack of FIGS. 1 and 2 is shown to be plugged into a translator or data processor.

Memory pack 14 is removably plugged into or otherwise readily detachably connected to the data input and control unit 16 so that it can conveniently be removed as a unit from system 10 for transportation to a remote station such as the central processing station 19 (see FIG. 3) where the data stored in memory pack 14 is read out for examination and/or processing.

To accomplish the foregoing information storage and read-out operations, memory pack 14 is provided with a suitable read/write or random access semiconductor memory (RAM) as indicated at 20 in FIG. 1. Advantageously, memory 20 is of the CMOS type and may be a conventional IC memory circuit for use with an address counter 22 and appropriate addressing logic for addressing the different locations in memory 20. Because of the volatile nature of the CMOS memory and further because of the desireability of transporting the memory pack 14 without losing the stored data, memory pack 14 includes its own power source in the form of a rechargeable battery 24.

Battery 24, rather than being a standby or auxiliary source of power, is the primary and sole power source for operating the addressing logic in memory pack 14 and for preserving the data stored in memory 20 not only when the memory pack 14 is unplugged or disconnected from the data input and control unit 16, but also when memory pack 14 is plugged in and connected to the circuitry in unit 16.

In the illustrated embodiment, battery 24 also used to furnish power to transducer 12 and the circuitry in the data input and control unit 16. System 10 therefore has a single power source which is incorporated as part of the removable memory pack 14. Alternatively, a separate battery source may be used for powering the circuitry outboard of the removable memory pack 14, but this arrangement requires the periodic recharging or replacement of two batteries and therefore does not possess the advantages of the single battery arrangement shown in the drawings.

It is understood that memory 20 includes the usual memory array of bit-storing semiconductor devices and the usual unshown interface circuitry, including the address register, drivers and other component parts. In the illustrated embodiment memory 20 includes a set of address terminals or lines 25 (one shown), a data input terminal or line 26, a data output terminal or line 27, a write/enable terminal or line 28, a strobe terminal or line 29 and a power input terminal of line 31. The output of the address counter is applied to the address terminals 25 which may collectively be referred to as an address port for addressing the memory. Battery is connected to terminal 31 to apply power to memory 20.

In the illustrated embodiment, in which the system 10 is used as a vehicular traffic counter, transducer 12 is constructed to provide a count of vehicular traffic passing a pre-selected point on a road or roadway 20 (see FIG. 2). Alternatively, transducer 12 may be constructed to sense some other condition or event such as the amount of rainfall. For such an application the transducer may be constructed to produce an electrical analog signal which is indicative of the amount of rainfall at a pre-selected place. To convert the analog signal into binary form the transducer may have an analog-to-digital converter for converting samples of the analog signal into a digital signal.

In the particular embodiment illustrated in FIG. 2, transducer 12 provides a count of the number of vehicle axles passing over a selected point or place or roadway 30. For this purpose transducer 12 is conventionally equipped with an elongated, hollow, pneumatic road tube 32 (see FIG. 2) which is stretched across one or more traffic lanes on roadway 30. Tube 32 is closed at its outer end and has its inner end opening into a transducing apparatus. With this construction an air pressure wave is produced within the tube by passage of a vehicle axle over the tube and is converted into an electrical pulse. In this embodiment, therefore, transducer 12 produces a digital pulse signal in which the number of serially occurring pulses is equal to the number of vehicle axles passing over road tube 32.

For the vehicle axle counting application shown in FIG. 2 the component parts of system 10 are advantageously mounted in a portable housing or carrying case 34 so that the system 10 takes the form of a portable, modular unit (as indicated at 35 in FIG. 2) which can be transported to a selected road location where it is desired to collect or accumulate vehicle traffic data. As shown in FIG. 2, carrying case 34 is advantageously provided with a lockable cover 36 which may be hinged at 37 to provide access to the component parts of system 10 within the carrying case. For convenience, case 34 may also be provided with a carrying handle 38.

In addition to accumulator 17 and timer 18, the data input and control unit 16 includes a shift register 40, memory control 42, a one-word generator 44, an axle miss detector 46, a master clear of reset circuit 47, logic control circuits 49 and 50, and the memory test circuit 51 of this invention. Timer 18 may be of any suitable free running, selectable type.

In the illustrated embodiment timer 18 cyclically or periodically times out to generate a single output pulse b (hereinafter referred to as the timer sample pulse) at an output terminal K. The frequency of the timer sample pulse preferably is selectively adjustable. The clock pulses (indicated at c) developed by the timer's oscillator or free-running square wave generator (not shown) are supplied at the timer's output terminal F.

The time interval between the timer sample pulses b is preferably adjustable over a relatively wide range such as 5 minutes to several hours and is usually selectively set to some suitable value depending upon the expected traffic volume and other factors. The frequency of the timer clock pulses c is much greater than that of the timer sample pulses b and may be of any suitable value.

As will be explained in greater detail shortly, each timer sample pulse is used as a command signal for initiating a data transfer cycle in which accumulated data is transferred from accumulator 17 to memory 20 by way of shift register 40. More specifically, the occurrence of a timer sample pulse causes the count accumulated in accumulator 17 to be transferred in parallel to shift register 40. From shift register 40 the data bits are then serially shifted into memory 20 in response to a one-word pulse signal d (FIG. 1) in which the number of bit-shifting pulses is equal to the number of register stages in shift register 40. The one-word generator 44 uses the timer's clock pulses c to generate the one-word pulse signal d.

Depending upon the condition of the pulses produced by transducer 12, a pulse conditioning circuit 52 may be employed and may include a Schmitt trigger 53 for squaring up the transducer's output pulse waveform and a monostable multivibrator 55 connected to the output of the Schmitt trigger for guaranteeing a fixed time duration for the transducer-produced pulses. The conditioned transducer pulses supplied by circuit 52 are counted in by accumulator 17 which may be a BCD counter of suitable type.

A suitable time delay and pulse conditioning circuit 54 is connected to the timer's output terminal K. Circuit 54 delays the timer sample pulse for a time interval that is sufficient to allow the system to settle down following reset action and before initiating the transfer of the data into memory 20.

The delayed timer sample pulses supplied by circuit 54 are indicated at b', and are applied to one input of the control circuit 49 and also to the axle miss detector 46. The axle miss detector 46 feeds a second input of the control circuit 49. The one word generator 44 feeds the third input of control circuit 49 as shown.

The digital signal at the output of logic circuit 49 is applied to the parallel-serial clock input of shift register 40. The parallel/serial enable input of shift register 40 is fed by the control circuit 50.

Shift register 40 has two operating modes, namely a parallel load mode and a serial shift mode. When register 40 is placed in its load mode, the plural bit word representing the accumulated count in accumulator 17 will be parallel loaded into register 40. When register 40 is in its shift mode, the bits in the register will be serially shifted through the register stages.

In the illustrated embodiment, the logic is such that shift register 40 will be parallel loaded by causing a low-to-high transition (a logic 0-to-logic 1 transition in this case) in the logic signal at the shift register's parallel-serial clock input while holding the shift register's parallel/serial enable input high and while applying the bits making up the word in accumulator 17 to the parallel inputs of the shift register.

To serially shift the bits in register 40, the register's parallel/serial enable input is held low (a logic 0) while feeding pulses to the register's parallel/serial clock input. With the shift register in its shift mode, each low-to-high transition in the pulse signal at the register's clock input shifts the data in the shift register one stage in a preselected direction.

Bringing the shift register's parallel/serial enable input high (a logic 1) inhibits serial shifting of the data through the register and enables the parallel loading of data. Bringing the shift register's enable input low inhibits loading while enabling the serial shifting of the data.

Figure 4:
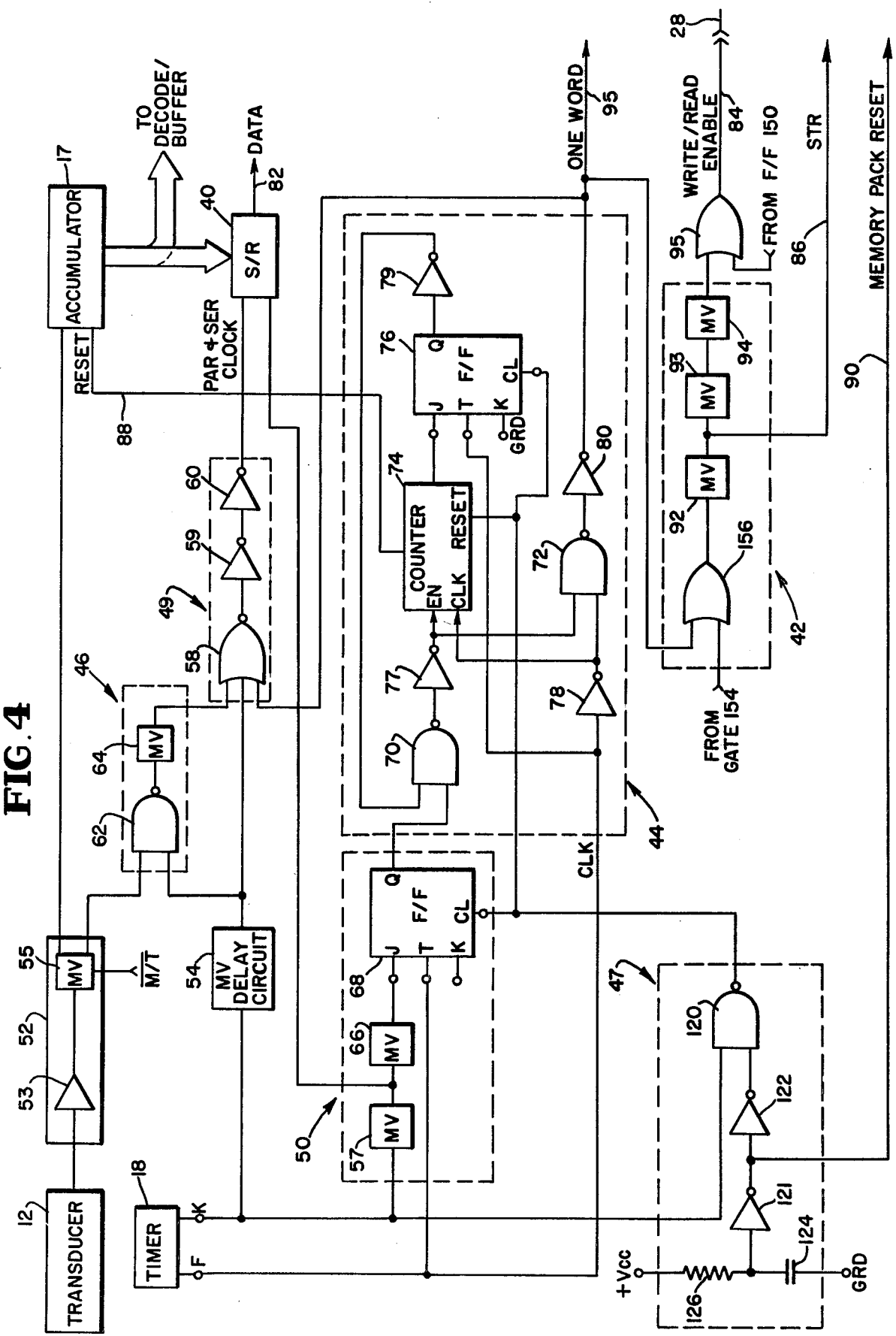
FIG. 4 is a schematic circuit diagram of the data input and control unit shown in FIGS. 1 and 2.

The parallel/serial enable input for shift register 40 is fed by a one-shot multivibrator 57 (see FIG. 4). Multivibrator 57 forms a part of the control circuit 50 and is triggered by the positive going edge of each timer sample pulse b to produce a positive going pulse of preselected time duration. This positive going multivibrator pulse is applied to the parallel/serial enable input of shift register 40. At the beginning of each timer sample pulse b, the parallel/enable input of shift register 40 is therefore brought high and held high for a pre-selected time period.

Control circuit 49 may comprise any suitable logic circuit design for applying the desired positive-going pulse edge to the parallel-serial clock input of shift register 40. For example, control circuit 49 may comprise a NOR gate 58 and a pair of inverters 59 and 60 as shown in FIG. 4. Gate 58 and inverters 59 and 60 are all connected in series so that inverter 60 feeds the parallel-serial clock input of shift register 40.

For the illustrated logic, it will be appreciated that when all three inputs of NOR gate 58 are low at a logic 0, the parallel-serial clock input for shift register 40 will be high at a logic 1. If a positive-going pulse is applied to one or more of the inputs of NOR gate 58 a negative-going pulse will be applied to the parallel-serial clock input of shift register 40 to provide a positive-going transition. This positive-going pulse edge effectuates the parallel loading of shift register 40 or the serial shifting of the shift register's data depending upon the logic state of the shift register's parallel/serial enable input.

From the circuitry thus far described it will be appreciated that the parallel/serial enable input of shift register 40 is immediately brought high in response to the leading edge of each timer sample pulse b. Also in response to the leading edge of each timer sample pulse b, circuit 54 produces the delayed sample pulse b' which will be gated by NOR gate 58 to the parallel-serial clock input of shift register 40 while the shift register's parallel/serial enable input is high. As a result, the pulse count summed up by and accumulated in by accumulator 17 will be transferred in parallel to shift register 40.

Because of the asynchronous timing between timer 18 and transducer 12, it is possible for transducer 12 to generate an axle count pulse a at the beginning of the delayed timer sample pulse b'. If this happens, an axle count may be lost or the data loaded into register 40 may otherwise be incorrect. Detector 46 is connected to circuits 52 and 54 to sense this unwanted condition.

In the illustrated embodiment, the axle miss detector 46 comprises a NAND gate 62 and a monostable multivibrator 64 connected to the output of gate 62.

The transducer-produced axle count pulses a of appropriate polarity are fed to one input of NAND gate 62, and the delayed timer sample pulses b' are fed to the other input of NAND gate 62. The output of NAND gate 62 will be held high at a logic 1 as long as the two pulse signals at the NAND gate's inputs are not high at the same time. Under this condition, the output of multivibrator 64 will be held low at a logic 0.

If, however, a positive going transducer-produced axle count pulse a occurs at the same time that a positive going delayed timer sample pulse b' is present, a negative going pulse will be developed at the output of NAND gate 62. Multivibrator 64 will trigger on the trailing or positive going edge of this negative going pulse to produce a delayed positive going pulse b".

The positive going edge of pulse b" will occur a short time after the delayed timer sample pulse b' and consequently a short time after the shift register's parallel-serial input is brought high. The positive going transition of pulse b" will therefore cause a second low-to-high transition at the parallel-serial clock input of shift register 40 a short time after the first positive going transition that was produced by the falling edge of the delayed timer sample pulse b'. This second positive going transition will occur while the shift register's parallel/serial enable input is still high. As a result, the contents of accumulator 17 will be transferred to shift register 40 a second time before accumulator 17 is reset to initiate a new counting cycle. The data loaded into shift register 40 will therefore be updated to provide an accurate count of the number of axles sensed by transducer 12.

After a time interval of about 3 ms the parallel/serial enable of shift register 40 is brought low by multivibrator 57 to place the shift register in its serial shift mode. This operation is effected by the completion of a positive going pulse at the output of multivibrator 57. The trailing edge of this positive going pulse also initiates the generation of the one-word data-shifting pulse signal d by generator 44. The one-word pulse signal d will therefore be applied to NOR gate 58 during the time in which the parallel-serial enable input of shift register 40 is low at a logic 0. As a result, each pulse in the one-word pulse signal d will serially shift the data bits in shift register 40 one stage in the proper direction for serially loading the bits into memory 20.

Any suitable circuit design may be employed for the one-word generator 44 and for the control circuitry used to initiate operation of generator 44. One suitable example of this circuitry is shown in FIG. 4 in which the control circuit 50 comprises a monostable multivibrator 66 and a flip flop 68 for initiating operation of the one-word generator 44. In this embodiment the one-word generator 44 is shown to comprise a pair of NAND gates 70 and 72, a binary up counter 74, a flip flop 76 and inverters 77–80.

The timer clock pulses c at terminal F of timer 18 are inverted by inverter 78 and applied to one input of gate 72. Upon being enabled gate 72 feeds the timer clock pulses to NOR gate 58 by way of inverter 80.

Gate 70 acts as the control element for gate 72 to enable gate 72 for a time interval that is just long enough to gate through a number of the timer's clock pulses equal to the number of bit-storing stages in shift register 40. Register 40 may have any suitable length such as 16 bits. For a 16-bit shift register gate 72 will be enabled just long enough to gate sixteen timer clock pulses to NOR gate 58.

Operation of gate 70 is under the control of flip flops 68 and 76, both of which may be of the JK type. Multivibrator 66 is connected to multivibrator 57 so that it will be triggered on the trailing edge of the positive going pulse which multivibrator 57 produced in response to each timer sample pulse b. Accordingly, as soon as the parallel/serial enable input of shift register 40 is brought low by multivibrator 57 following the transfer of data from accumulator 17 to shift register 40, the output of multivibrator 66 is brought high.

This output of multivibrator 66 is applied to the J input of flip flop 68 and the timer clock pulses c are applied to the flip flop's clock input. With this circuit arrangement the Q output of flip flop 68 is set high on the first positive going timer clock pulse c following the transition of the output of multivibrator 66 from its low to high state. The Q output of flip flop 68 is applied to one input of NAND gate 70.

The other input of NAND gate 70 is fed by the Q output of flip flop 76 by way of inverter 79. The Q output of flip flop 76 is normally low when the count in counter 74 is zero and remains low at a logic 0 until 16 pulses are counted in by counter 74.

The Q output of flip flop 76 will therefore be low at the start of each timer sample pulse b. This flip flop output is inverted by inverter 79 so that the associated input of gate 70 will be high at a logic 1 at the beginning of each timer sample pulse. Gate 70 is therefore placed in an enabling condition at the beginning of each timer sample pulse b.

Thus, when the output of flip flop 68 is brought high in the manner described above, the output of gate 70 will be brought low to a logic 0. This logic state will be inverted by inverter 77 to bring the enable input of counter 74 high. It will be appreciated that this condition occurs on the first rising edge in the timer clock pulse signal c following the instant at which the parallel/serial enable input of shift register 40 is brought low to change the operating condition of shift register 40 from its load mode to its serial shift mode. When the enable input of counter 74 is brought high by gate 70, the counter will be enabled to begin the count-in of the timer clock pulses c which are fed to the clock input of the counter by way of inverter 78.

As shown in FIG. 4 the timer clock pulses c are also fed to the clock input of flip flop 76. The data output connection of counter 74 to the J input of flip flop 76 is such that flip flop's J input is brought from low to high upon advancing the count in counter 74 to 15.

With these circuit connections the Q output of flip flop 76 will be held low at a logic 0 until the pulse count in counter 74 reaches 15. As a result, gate 70 will be in its enabled state. The output of gate 70 will therefore be brought low when the Q output of flip flop 68 is brought high. This output of gate 70 enables gate 72. As a result, timer clock pulses c will be gated through gate 72 to NOR gate 58.

As long as gate 72 remains in its enabled state timer clock pulses c will be fed to NOR gate 58. The positive going transition of each timer clock pulse c applied to the input of NOR gate 58 will result in a positive going transition at the parallel-serial clock input of shift register 40. Since gate 72 will be enabled only when the parallel/serial enable input of shift register 40 is low, then the application of the timer clock pulses c to NOR gate 58 will serially shift the data bits in register 40 out of the shift register and into memory 20 by way of the data input line 82.

Counter 74 keeps account of the number of bit-shifting timer clock pulses c by counting them as they are applied through gate 72 to NOR gate 58 for serially shifting the bits out of register 40. Upon counting in the 15th bit-shifting pulse in the train of pulses applied to gate 58, counter 74 brings the J input of flip flop 76 high. On the occurrence of the 16th bit-shifting pulse, therefore, the output of flip flop 76 will be brought high. This logic state will be inverted by inverter 79 to disable gate 70. As a result, the output of gate 70 will be brought high, causing the output of inverter 77 to go low to a logic 0. By bringing the output of inverter 77 low, gate 72 will be disabled and counter 74 will be reset to zero.

By disabling gate 72 the supply of timer clock pulses c to NOR gate 58 will be terminated. Since the disablement of gate 72 occurs on the count-in of the 16th timer clock pulse c by counter 74 the number of timer clock pulses applied to gate 58 for each timer sample pulse will be limited to sixteen. The sixteen data-shifting pulses at the input of NOR gate 58 will be just enough to serially transfer the 16 bit data word in register 40 to memory 20. This 16 bit word will be written into memory 20 at pre-selected addresses by application of appropriate logic states on the memory's write/enable and strobe lines which are respectfully indicated at 84 and 86 in FIG. 1.

The time duration for the positive going pulse produced by multivibtator 66 is adjusted so that it terminates with the count-in of the sixteenth counter clock pulse by counter 74. The J input of flip flop 68 is therefore brought low upon the count-in of the sixteenth timer clock pulse which makes up the last pulse in the data-shifting pulse signal d. On the occurrence of the next timer clock pulse the Q output of flip flop 68 will therefore be brought low.

By resetting counter 74 to zero on the count-in of the sixteenth timer clock pulse, the J input of flip flop 76 will be brought low. On the next timer clock pulse the Q output of flip flop 76 will consequently be brought low to re-apply the logic 1 enabling signal to gate 70. By this time, however, the Q output of flip flop 68 is low to hold the output of gate 70 high.

As a result, gate 72 will be held in its disabled state and counter 74 will be held in its reset state. Disabling gate 72 inhibits the transfer of the timer clock pulses c to the input of NOR gate 58. Placing counter 74 in its reset state prevents the counter from counting in timer clock pulses. Generator 44 and control circuit 50 are now in condition for producing a new data-shifting pulse signal d in response to the occurrence of the next timer sample pulse a.

Flip flop 76 has the effect of preventing the sixteenth clock pulse in the data-shifting digital signal d from becoming splintered. The sixteenth clock pulse in the data-shifting signal d will therefore be full size to ensure proper shifting operation of the bits in register 40.

A circuit connection indicated at 88 in FIGS. 1 and 4 is provided between counter 74 and the reset pin of accumulator 17 to reset accumulator 17 as soon as counter 74 reaches a count of eight. The output of counter 74 will be high between the eighth and sixteenth counts. Accumulator 17 will therefore be reset in the time interval following the parallel transfer of data to register 40 and before the circuit completes the transfer of data from register 40 to memory 20. Alternatively the circuitry may be designed to reset accumulator 17 as soon as counter 74 is enabled to begin the count-in for generating the sixteen bit data shifting signal.

In the illustrated embodiment memory 20 advantageously is of the single-plane type having a multitude of address locations for storing one-bit words. Each bit in the data word supplied by shift register 40 will therefore be stored at a different address location in memory 20.

For example, the bits in the sixteen-bit data word from register 40 may conveniently be written into the first sixteen address location 1 through 16 in memory 20 with one bit being stored at each address. The next data word transferred from accumulator 17 to register 40 will then be written into the sixteen succeeding addresses 17 through 32, and so on. The bits of each data word transferred from register 40 will therefore be stored at consecutive address locations in memory 20.

The foregoing type of memory has a number of advantages. First, it efficiently utilizes the available storage capacity. Second, the circuit design or memory architecture associated with such a one-plane memory is more simplified than the one for a plural plane memory.

Furthermore, with the simplified memory architecture of the illustrated embodiment, the one-word generator 44 is advantageously utilized to load the appropriate addresses into the memory's address counter 22 for writing in the axle count information.

The count which the address counter 22 is capable of generating is determined by the number of address locations or storage positions in memory 20. If, for example, there are 1,024 different address locations or one-bit memory cells or storage elements in the single plane memory 20, then an address of up to 1,024 must be made available by the address counter 22.

As shown in FIGS. 1 and 4, the output of the one-word generator 44 which is taken from inverter 80, is applied through an OR gate 93 to the address counter 22 by way of line 95. Accordingly, the pulses in the one-word pulse signal d will be applied to counter 22 to advance the count in the counter.

When power is first applied to the data input and control unit 16 to initiate an information collection operation, the master clear and reset circuit 47 will operate to reset the address counter 22 to zero by way of reset line 90. At the time of the occurrence of the first timer sample pulse b from timer 18, the count in counter 22 will therefore be zero.

In response to the first timer sample pulse b, the first one-word pulse signal d will be generated by the one-word generator 44 for serially shifting the data bits into memory 20 from register 40. The first pulse in this first occurring pulse signal d will advance counter 22 to the count of 1. Accordingly, the first bit serially shifted out of register 40 will be stored in memory 20 at the address location corresponding to the numeral 1. Upon counting in the second pulse in the first-occurring pulse signal d, the count in counter will advance to 2. The second bit serially shifted out of register 40 will therefore be stored in memory 20 at the next address location corresponding to the numeral 2, and so on. Accordingly, by connecting the address counter 22 to count in the pulses in the one-word pulse signal d, the 16 bits of the first data word serially shifted out of register 40 will respectively be stored in order at the consecutive address locations 1 through 16 in memory 20.

In response to the second timer sample pulse b, which follows the first timer sample pulse after the elapse of the timer's selectively adjusted time interval, the second occurring one-word pulse signal d will be produced by the one-word generator 44. Address counter 22 will also count in the pulses in this second-occurring one-word signal d.

However, at the time that the second-occurring one-word pulse signal d occurrs the count in counter 22 will be at 16. Therefore, the count in the address counter 22 will be advanced to 17 upon counting in the first pulse in the second-occurring one-word pulse signal d. The first bit in the second data word loaded into register 40 will consequently be stored in the next address location 17. On the occurrence of the second pulse in the second-occurring one-word pulse signal d, the count in counter 22 will advance to 18. The second bit in the second data word will therefore be stored at the next address location 18, and so on.

Thus, the 16 bits in the second data word from register 40 will be stored in order at the memory's consecutive address locations starting with the address location 17 and ending with the address location 32. From this description it is apparent that the bits of the third data word from register 40 will be stored in order in the next 16 consecutive address locations in memory 20, starting with the address location 33 and ending with the address location 48. The one-word generator 44 thus operates as an incrementer for the address counter 22 to load consecutive addresses into the address counter.

The output of the one-word generator 44 is also connected to memory control circuit 42 whereby the operation of the memory control circuit 42 is placed under the control of the pulses in each of the one-word pulse signals d produced by generator 44 to synchronize the generation of the write/enable and strobe pulse signals with the addresses loaded into address counter 22. Memory control circuit 42 may be of any suitable circuit design for generating the write/enable and strobe signals at the proper times for writing in the serially applied data bits on line 82 at the proper address locations in memory 20. An example of a suitable circuit design for the memory control circuit 42 is shown in FIG. 4 to comprise three serially connected monostable multivibrators 92, 93 and 94.

Multivibrator 92 is triggered on the positive going or leading edge of each positive going pulse in the one-word generator's digital pulse signal d to produce a positive going strobe pulse which has a pre-selected duration and which is fed to the strobe input of memory 20 by of an OR gate 95 and the strobe line 86. The strobe pulse produced by multivibrator 92 is also applied to multivibrator 93.

Multivibrator 93 will be triggered on the negative going or trailing edge of the strobe pulse to produce a delayed negative going pulse. The leading edge of this delayed pulse will occur a short time after the leading edge of the positive going triggering pulse in the one-word pulse signal d. This delayed pulse is applied to trigger multivibtator 94. The connections are such that multivibrator 94 will produce the desired negative going write/enable pulse on the trailing edge of the delayed pulse from multivibtator 93. The write/enable pulse therefore occurs a short time after the completion of the strobe pulse, and the time interval between the strobe and write/enable pulses is equal to and set by the width of the delayed pulse from multivibrator 93.

One strobe pulse and one write/enable pulse will be generated in response to and during the interval of each timer clock pulse c in each of the one-word pulse signals d produced by the one-word generator 44. In response to each set of sequentially occurring strobe and write/enable pulses, memory 20 will operate in the usual manner to write in the bit appearing at its data input terminal at the address location supplied by the address counter 22.

In addition to the circuitry thus far described the data input or control unit 16 may also include a digital display 100 for displaying the count accumulated in accumulator 17. To accomplish this the parallel output of accumulator 17 is connected by way of a conventional decoder and buffer circuit 102 to the digital display 100. A switch 104 may be provided for manually energizing the digital display 100. The assembly of the digital display 100, the decoder and buffer circuit 102 and switch 104 are advantageoulsy housed in casing 34.

To facilitate the ready connection and disconnection of the removable memory pack 14 with respect to the data input and control unit 16 the component parts of pack 14—specifically memory 20, address counter 22 and battery 24—are advantageously mounted on a single card which is schematically indicated at 106 in FIG. 1. Additionally, a suitable connector unit or assembly 108 having a detachable, mating male and female connectors 110 and 112 is provided for establishing the necessary circuit connections between the memory pack 14 and the data input and control unit 16.

The master reset circuit 47 is connected to be energized by battery 24 upon plugging the removable memory pack 14 into the data input and control unit 16 to clear counters 22 and 74 and flip flop 68 and 76. In the illustrated embodiment circuit 47 comprises a NAND gate 120, a pair of inverters 121 and 122 and a capacitor 124.

As shown, capacitor 124 and a resistor 126 are connected in series between the positive battery terminal $V_{cc}$ and earth ground. Inverters 121 and 122 are connected in series between the junction of capacitor 124 and resistor 126 and one input of NAND gate 120. The timer sample pulse at output terminal K of timer 18 feeds the other input of NAND gate 120. The output of NAND gate 120 in turn is connected to the clear terminals of flip flops 68 and 76 and counter 74 as shown in FIG. 4. The output of inverter 121 is connected through an OR gate 127 in circuit 51 and line 90 to the reset terminal of counter 22.

Before plugging memory pack 14 into unit 16, capacitor 124 will normally be fully discharged so that both capacitor plates will be at ground potential. When pack 14 is first plugged into unit 16, the input to inverter 121 will therefore be low at 0 volt. As a result, the output of inverter 121 will initially be brought high to reset counter 22.

When the output of inverter 121 is brought high, the output of inverter 122 will be brought low. The output of NAND gate 120 will consequently be high to place flip flops 68 and 76 and counter 74 in their cleared states.

As soon as memory pack 14 is plugged into unit 16, battery 24 will begin to charge capacitor 124 through resistor 126. After a short time, sufficient positive voltage is built up by the capacitor charge to cause the output of inverter 121 to be pulled to its logic 0 state at zero volts, thus completing the reset pulse to counter 22. At the same time the output of inverter 122 will be brought high, but the output of NAND will remain high at a suitable positive voltage until timer 18 times out to produce a timer sample pulse b.

As soon as the timer sample pulse b is applied to gate 120, the output of gate 120 will be brought low to zero volts, thus conditioning flip flops 68 and 76 and counter 74 for operation in the manner previously described. Upon termination of the timer sample pulse, the output of gate 120 will be brought high again so that throughout the time interval between timer sample pulses flip flops 68 and 76 and counter 74 will be held in their cleared states.

In accordance with this invention memory 20 will be programmed with a special code after the data stored in the memory has been read out and before the memory pack is re-used. When the memory pack is again plugged into a recording system to store new data in another traffic counting operation it therefore will initially contain the special code mentioned above.

Upon plugging the memory pack into the recording unit memory test circuit 51 of this invention is automatically activated to interrogate the memory cells or character positions in memory 20 prior to the traffic counting operation. If circuit 51 fails to sense or recognize the special code it will cause the display unit 100 to flash 0 characters, thereby notifying the person operating the system to the presence of data other than the special code in the inserted memory pack. In this way a memory pack having one or more defective cells or data from a prior traffic counting operation will be detected.

Advantageously, the special code may be an F type code in which the character "F" (a bit having a logic 1 state) is recorded in each of the usable character positions or memory cells in memory 20. Memory pack 14 is programmed with this F type code after the original data is read out and just prior to re-use of the memory pack. Preferably the memory 20 is programmed with the F type code after battery 24 has been fully charged and preferably after a memory test is conducted on the memory to ensure that the memory cells are all in working order. Thus, upon plugging memory pack 14 into the recording system for initiating a new traffic counting operation it will contain the F type code if the memory has not been damaged or become defective in some way in transit.

Figure 5:
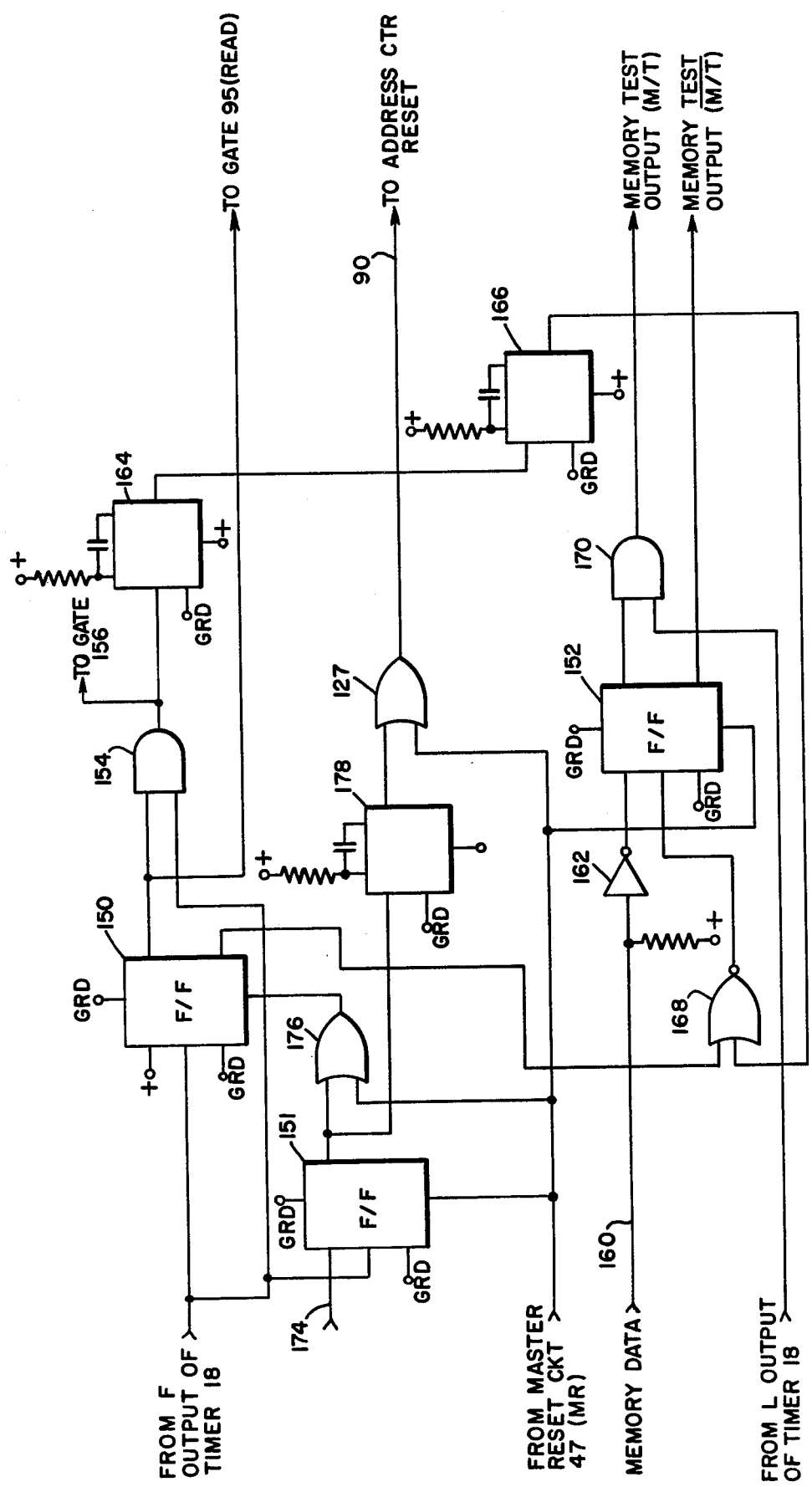
FIG. 5 is a schematic diagram of the memory test circuit according to one embodiment of this invention.

In order to interrogate or check the logic state of the data bits at each usable character position in memory 20, circuit 51 is designed to increment counter 22 through all of the usable character positions in memory 20 while holding memory 20 in its read mode and checking the data bits as they are serially read out by advancement of the address counter. To accomplish this the memory test circuit 51 is shown in FIG. 5 to comprise three flip flops 150, 151 and 152 together with a gate and multivibrator logic circuit design to be described shortly. The inputs for memory test circuit 51 include the master reset pulse (MR), a relatively low frequency pulse signal from a third output L of timer 18, the high frequency timer output pulse signal from the F output of timer 18, the data output from memory 20, and an end-of-test signal from address counter 22 to indicate when the counter has been incremented to its maximum count.

As shown flip flops 150–152 are connected to the master reset circuit 47 so that they will be reset by the master reset pulse MR upon plugging the memory pack 14 into the recording system to apply power to circuit 16. The F output of timer 18 is connected to the center trip of flip flop 150 to feed the high frequency timer pulses (approximately 27 kHz) to the flip flop. Flip flop 150 is further connected to positive battery and ground in the manner shown so that immediately following reset the first positive pulse of the 27 kHz timer signal sets and latches the Q output of flip flop 150 positive. The Q output of flip flop 150 feeds one input of an AND gate 154. The other input of gate 154 is fed by the 27 kHz pulse signal from timer 18. Gate 154 will therefore be enabled when the Q output of flip flop 150 is set positive by the first 27 kHz pulse to feed the 27 kHz timer pulses to OR gate 93 for application to the input of address counter 22. Enabling gate 154 in the foregoing manner therefore supplies the high frequency timer pulses to counter 22 for incrementing counter 22 in the memory test.

The output of gate 154 is also fed through an OR gate 156 to multivibrator to initiate the strobe signal on line 86. The Q output of flip flop 150 is additionally fed through OR gate 95 to set and hold memory 20 in its read mode. When memory 20 is set to its read mode it will be appreciated that no new data can be written into the memory.

Since the output of flip flop 150 is positive to place memory 20 in its read mode it will allow the bits in the memory cells of memory 20 be read out as each memory cell location is consecutively addressed by the address counter 22. The read-out bits are serially fed into memory test circuit 51 where they are inverted by an inverter 162 and then applied to the J or data input of flip flop 152.

In addition to incrementing counter 22, the 27 kHz timer signal at the output of gate 154 will be fed to a multivibrator 164 to trigger the multivibrator. Multivibrator 164 in turn triggers a second multivibrator 166 to produce a data sample pulse DS. Accordingly, one data sample pulse DS will be generated at the output of multivibrator 166 for each of the 27 kHz timer pulses at the output of gate 154.

Each data sample pulse DS is coupled through a NOR gate 168 to the center trip of flip flop 152. A data sample pulse DS will therefore be applied to flip flop 152 for each bit that is read out of memory 20 and applied to the data input of flip flop 152. The data sample pulse will occur at the time that its associated bit is present at the data input of flip flop 152, thereby sampling the logic state of the applied data bit.

If the read-out bit has a logic state of 1 in memory 20 it will have a logic state of 0 at the data input of flip flop 152, having been inverted by inverter 162. The Q output of flip flop 152 will therefore be low at 0 volts rather than positive if a one bit (a bit having a logic 1 state) is stored at the addressed location in the memory. Accordingly, the Q output of flip flop 152 will never go positive as long as one bits read out of memory 20. However, if a bit having a logic 0 state is read out of memory 20 the output of inverter 162 will go positive. The data input of flip flop 152 will therefore be brought positive at sample time, causing the Q output of flip flop 152 to latch positive to indicate a memory failure.

Still referring to FIG. 5, the Q output of flip flop 152 feeds one input of an AND gate 170. The other input of gate 170 is fed by the relatively low frequency pulses from the L output of timer 18. The output of gate 170 is connected to the decoder 102 for the digital display unit 100.

From the description thus far it will be appreciated that if one bits are read out of memory 20 as address counter 22 stepped through each memory address position the Q output of flip flop 152 will never go positive. Gate 170 will therefore be held in its inhibited state to prevent the slow frequency timer pulses from the L output of timer 18 from being fed to encoder 100. As a result, display unit 100 will not display the flashing 0's, thereby indicating a satisfactory memory test. When a bit having a logic 0 state is read out of memory 20, however, the Q output of flip flop 152 will be latched positive to enable gate 152, thereby allowing the slow frequency timer pulses from the L output of timer 18 to be fed to decoder 102. The circuit design of decoder 102 is such that it responds to the incoming slow frequency pulses from the L output of timer 18 to cause all of the digit positions in display unit 100 to flash 0's at the rate of the slow frequency pulses from the L output of timer 18. The person operating the recording system will therefore be alerted to the presence of data having an unacceptable logic 0 state in memory 20, thus indicating that data is stored in the memory or that the memory pack is defective for one reason or another.

The last stage of address counter 22 is connected by line 174 to the J or data input of flip flop 151. The high frequency timer pulses from the F output of timer 18 feed the center trip of flip flop 151. Flip flop 151, as will become apparent shortly, is used to terminate operation of the memory test circuit upon the completion of a successful memory test in which all one bits are read out of the memory.

Assuming that one bits are in all of the character locations in memory 20, address counter 22 will be allowed to process all of the bits by stepping to its maximum count. When this happens the output of the counter's last stage on line 174 will be brought positive causing the Q output of flip flop 151 to be set positive. The Q output of flip flop 151 is connected through an OR gate 176 to the reset of flip flop 150. Gate 176 is used to OR the inputs from flip flop 151 and the master reset circuit 47.

Thus, when the count in counter 22 reaches its maximum value (e.g., 32,768 pulses or counts) to drive the Q output of flip flop 151 positive, flip flop 150 will be reset. When this happens gate 154 will be inhibited to stop the advancement of counter 22 and to terminate testing operation. Upon resetting flip flop 150 at the end of the memory test memory 20 will be restored to its write mode for writing in data in a traffic counting operation.

As shown, the $\overline{Q}$ output of flip flop 150 is connected to one input of gate 168. When flip flop 150 is reset by flip flop 150 the $\overline{Q}$ output of flip flop 150 will be driven positive, thus causing the output of gate 168 to prevent flip flop 152 from operating during the ensuing traffic counting operation.

The Q output of flip flop 151 also feeds a further multivibrator 178. Multivibrator 178 in turn feeds one input of gate 127. With this circuitry it is apparent that when the Q output of flip flop 151 is driven positive to terminate the testing operation multivibrator 178 will be triggered to feed a reset pulse through gate 127 to reset address counter 22 in preparation for a traffic counting operation.

Referring to FIGS. 4 and 5, the $\overline{Q}$ output of flip flop 152 may be connected to the clear pin of multivibrator 55. Normally the $\overline{Q}$ output of flip flop is at some suitable positive voltage to keep multivibrator 55 enabled when no failure is signalled by the memory test circuit 51. However, when memory test circuit 51 signals a failure in the memory test the $\overline{Q}$ output of flip flop 152 will be brought low to 0 volts, thereby inhibiting multivibrator 55. By inhibiting multivibrator 55 none of the traffic count pulses generated by transducer 12 will be fed to accumulator 17 for count-in. As a result, the recording system will be locked-up or inhibited to prevent the count-in of new data when a failure is signalled by the memory test circuit 51.

From the foregoing description it is apparent that if it is desired to re-run the memory test it is only necessary to remove or pull out the memory pack from the recording unit and to re-insert it into the recording system. When this is done the master reset circuit 47 will generate a new reset pulse MR to reset the flip flops, thereby initiating a new memory test.

To initiate operation or the recording system with the memory test circuit of this invention memory pack 14 is inserted or plugged into the data input and control unit 16 to apply power to the circuits and to initiate the previously described operation of the memory test circuit 51. While the memory test is in progress, any traffic counts generated by transducer 12 will not be recorded because memory 20 will be in its read mode throughout the memory test. If the memory test is successful then memory 20 will automatically be placed in its write mode for accepting counts in. If a vehicle count is desired rather than an axle count it will be appreciated that circuit 52 may be equipped with a divide-by-two counter so that one traffic count pulse will be fed to accumulator 17 for count-in for every two pulses produced by transducer 12.

After the desired information is stored in memory 20, memory pack 14 is removed from system by unplugging it from unit 16. Memory pack 14 then may be transported under the power furnished by battery 24 to some remote location such as station 19 without loss of the information written into memory 20. Because of the previously described construction of memory pack 20, it is small enough to be portable and hand carried so that it can conveniently be transported from one location to another.

A data processor or translator 130 (see FIG. 3) may be located at station 19 for reading out the data stored in memory 20. The read-out may be accomplished in any suitable way.

In the illustrated embodiment, pack 14 is conveniently pluggable into translator 130 to provide the necessary connections to the memory's data output terminal 27, the strobe and enable terminals and the address counter input and reset lines or terminals 132 and 133 (see FIG. 1) for counter 22. Memory 20 may be addressed for reading out the stored data by advancing the count in counter 22.

To accomplish this, translator 130 may be equipped with a pulse generator (not shown) which is connectable to line 132 through connector 112 to apply a train of pulses for incrementing or advancing the count in the address counter 22 one count at a time. In this manner the various bit-storing address locations in memory 20 are addressed in the consecutive order to provide for the serial read-out of the stored data words on the data output line 27 upon applying the appropriate digital signal states to the enable and strobe lines 28 and 29. Generation of the enable and strobe signals on lines 28 and 29 in synchronism with the counter-incrementing pulses on line 132 may be accomplished by any suitable circuit design in translator 130. Alternatively, the advancement of the count in address counter 22 and application of the appropriate electrical signal states to lines 28 and 29 may be accomplished selectively or manually to effectuate the read-out of the data stored in memory 20. The data read out on line 27 may be fed to a suitable read-out device (e.g., a digital display or printer) to indicate the numerical value of each binary word. This read-out device may form a part of translator 130.

As shown in FIG. 1, a common or d.c. ground 150 is provided in memory pack 20 for battery 24 and the circuits in pack 20. The negative terminal of battery 24 is connected to ground 150.

The terminals marked GRD for timer 18 and the various circuits in the data input and control unit 16 advantageously are all connected in parallel through connector assembly 108 to ground 150 in pack 14 in the manner shown to complete the circuit connections for feeding current from battery 24. It will be appreciated that ground 150 is not at earth potential. When pack 14 is plugged into unit 16, therefore, each pair of lines marked $V_{cc}$ and GRD in unit 16 will be hot. It further will be appreciated that the circuit design could be such to provide an earth ground instead of the d.c. ground 150.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. In an information recording system having means for supplying a plurality of serially occurring electrical pulses in which the number of said pulses is indicative of certain information, a memory storage unit having an integrated circuit memory containing a plurality of binary storage locations for storing binary data, an electrical circuit, and means providing for the detachable connection of said memory storage unit to said electrical circuit to enable said storage unit to be selectively connected to said circuit and also to be selectively disconnected from said electrical circuit and removed from said information recording system, said electrical circuit being connected to said pulse supplying means and including means for counting said pulses to obtain a pulse count and for writing into said memory binary data resulting from the pulse count, and said memory being capable of storing a pre-selected code before said storage unit is connected to said electrical circuit, the improvement comprising further means forming a part of said electrical circuit and connected to said memory when said unit is connected to said electrical circuit for interrogating the logic bit state in each of said storage locations to determine if the logic states conform to said pre-selected code, and means rendered effective by said interrogating means for signalling an operator of the information recording system whenever the logic state in any one of said storage locations fails to conform to said code.

2. In an information recording system having means for supplying a plurality of serially occurring electrical pulses in which the number of said pulses is indicative of certain information, a memory storage unit, an integrated circuit memory forming a part of said unit and having a multiplicity of bit storage locations for storing binary data, an electrical circuit, and means providing for the detachable connection of said storage unit to said electrical circuit to enable said storage unit to be selectively connected to said circuit and also to be selectively disconnected from said electrical circuit and removed from said information recording system, said electrical circuit being connected to said pulse supplying means and including means for counting said pulses to obtain a pulse count and for writing into said memory binary data resulting from the pulse count, said memory being capable of storing a pre-selected code before said storage unit is connected to said electrical circuit, the improvement comprising further means forming a part of said circuit and responsive to the connection of said storage unit to said circuit for interrogating the logic bit state in each of said storage locations in said memory to determine if the logic states conform to said pre-selected code, and means rendered effective by said interrogating means for signalling an operator of the information recording system whenever the logic state in any one of said storage locations fails to conform to said code.

3. The information recording system defined in claim 2 wherein said pulse supplying means is electrically connected to said interrogating means to be inhibited from supplying said pulses to said counting means whenever said interrogating means determines that the logic state in any one of said storage locations fails to conform to said code.

4. In an information collection and storage system having means for supplying a train of serially occurring electrical pulses in which the number of pulses is indicative of certain information, an electrical circuit connected to said pulse supplying means, a memory storage unit, means providing for the detachable connection of said storage unit to said electrical circuit to enable said storage unit to be selectively connected to said electrical circuit and also to be selectively disconnected from said electrical circuit and removed from said information collection and storage system for transportation to a selected location, a read/write, integrated circuit memory forming a part of said storage unit and having a multiplicity of storage locations for storing information in binary form, said memory being capable of storing a pre-selected code before said storage unit is connected to said electrical circuit, means forming a part of said storage unit for addressing the different storage locations in said memory, first means forming a part of said electrical circuit for counting said pulses, second means forming a part of said electrical circuit and connected to said first means and also to said memory and said memory address means when said storage unit is connected to said electrical circuit for writing into said memory data resulting from the counting of said pulses by said first means, and battery means in said storage unit for preserving the data stored in said memory at least when said storage unit is removed from said system, said battery means further providing for the preservation of said code when said code is written into said memory before said storage unit is connected to said electrical circuit, the improvement comprising means forming a part of said electrical circuit and connected to said memory and said memory address means when said storage unit is connected to said electrical circuit for interrogating the logic bit state in each of said storage locations to determine if the logic states conform to said pre-selected code, and means rendered effective by said interrogating means for signalling an operator whenever the logic state in any one of said storage locations fails to conform to said code.

5. The information collection and storage system defined in claim 4 wherein said electrical circuit includes means for inhibiting data from being written into said memory when said interrogating means senses the absence of said code upon the connection of said storage unit to said electrical circuit.

* * * * *